United States Patent
Stanciu et al.

(10) Patent No.: US 9,294,134 B2
(45) Date of Patent: Mar. 22, 2016

(54) VITERBI DECODING DEVICE AND METHOD FOR DECODING A SIGNAL PRODUCED BY A CONVOLUTIONAL ENCODER

(75) Inventors: Mihai-Ionut Stanciu, Bucharest (RO); Ioan-Virgil Dragomir, Bucharest (RO); Khurram Waheed, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/427,029

(22) PCT Filed: Sep. 14, 2012

(86) PCT No.: PCT/IB2012/054796
§ 371 (c)(1),
(2), (4) Date: Mar. 10, 2015

(87) PCT Pub. No.: WO2014/041401
PCT Pub. Date: Mar. 20, 2014

(65) Prior Publication Data
US 2015/0222297 A1    Aug. 6, 2015

(51) Int. Cl.
*H04L 27/06* (2006.01)
*H03M 13/41* (2006.01)
*H04L 1/00* (2006.01)

(52) U.S. Cl.
CPC .......... *H03M 13/41* (2013.01); *H03M 13/4107* (2013.01); *H04L 1/0054* (2013.01)

(58) Field of Classification Search
CPC .............................. H03M 13/41; H04L 1/0054
USPC ........................................................ 375/341
See application file for complete search history.

(56) References Cited

U.S. PATENT DOCUMENTS

| | | | |
|---|---|---|---|
| 4,979,175 A | 12/1990 | Porter | |
| 5,027,374 A | 6/1991 | Rossman | |
| 5,295,142 A | 3/1994 | Hatakeyama | |
| 6,810,095 B2 | 10/2004 | Naitou | |
| 6,968,495 B2 | 11/2005 | Son et al. | |
| 7,062,701 B2 | 6/2006 | Traeber | |
| 7,114,122 B2 * | 9/2006 | Shih .............................. | 714/795 |
| 7,331,013 B2 | 2/2008 | Rudosky et al. | |

(Continued)

FOREIGN PATENT DOCUMENTS

KR    10-2007-0061220 A    6/2007

OTHER PUBLICATIONS

G.D. Forney, Jr., "The Viterbi algorithm," Proc. IEEE, vol. 61, pp. 268-278, 1973.*

(Continued)

*Primary Examiner* — Nader Bolourchi

(57) ABSTRACT

A Viterbi decoding device to decode a signal produced by a convolutional encoder is described. The device may include: an analog-to-digital conversion unit to extract a soft symbol S=(S0, S1) from the signal, the soft symbol including a first sample value S0 and a second sample value S1; and a digital processing unit to compute, for each of the N states, a branch metric value of BM_0_K in dependence on the soft symbol S, K being an index identifying the respective state. The digital processing unit may store the soft symbol S as a complex number S=S0+J*S1 in a complex number format; and compute a complex branch metric value BM_0_(K, K')=BM_0_K+J*BM_0_K' in a complex number format on the basis of the soft symbol S, with K different from K'.

20 Claims, 14 Drawing Sheets

| 1 | 2 | 3 | 4 | 5 |
|---|---|---|---|---|
| K | CW_0 BIN | CW_0 DEC | BM_0 | BM_0 |
| 0 | 00 | 0 | +S0+S1 | Re(S*(1-J)) |
| 1 | 10 | 2 | -S0+S1 | Im(S*(1-J)) |
| 2 | 00 | 0 | +S0+S1 | Re(S*(1-J)) |
| 3 | 10 | 2 | -S0+S1 | Im(S*(1-J)) |
| 4 | 11 | 3 | -S0-S1 | Re(S*(-1+J)) |
| 5 | 01 | 1 | +S0-S1 | Im(S*(-1+J)) |
| 6 | 11 | 3 | -S0-S1 | Re(S*(-1+J)) |
| 7 | 01 | 1 | +S0-S1 | Im(S*(-1+J)) |
| 8 | 11 | 3 | -S0-S1 | Re(S*(-1+J)) |
| 9 | 01 | 1 | +S0-S1 | Im(S*(-1+J)) |
| 10 | 11 | 3 | -S0-S1 | Re(S*(-1+J)) |
| 11 | 01 | 1 | +S0-S1 | Im(S*(-1+J)) |
| 12 | 00 | 0 | +S0+S1 | Re(S*(1-J)) |
| 13 | 10 | 2 | -S0+S1 | Im(S*(1-J)) |
| 14 | 00 | 0 | +S0+S1 | Re(S*(1-J)) |
| 15 | 10 | 2 | -S0+S1 | Im(S*(1-J)) |

(56) References Cited

U.S. PATENT DOCUMENTS 7,487,432 B2 2/2009 Ashley et al.
2008/0209305 A1 8/2008 Sato

OTHER PUBLICATIONS

International Search Report and Written Opinion correlating to PCT/IB2012/054796 dated Mar. 13, 2013.

Biver Marc et al: "In-Place Updating of Path Metrics in Viterbi Decoders", IEEL Journal of Solid-SIAE Circuits. vol. 24. No. 4. Aug. 1989, pp. 1158-1160.

Shieh Ming-Der et al: "Efficient Management of In-Place Path Metric Update and its Implementation for Viterbi Decoders", Proceedings of the IEEE International Symposium on Circuits and Systems, vol. 4, pp. 449-452, 1998.

* cited by examiner

| 1 | 2 | 3 | 4 | 5 |
|---|---|---|---|---|
| K | CW_0 BIN | CW_0 DEC | BM_0 = D(CW_0,S) | BM_0_K = D(CW_0,S) |
| 0 | 00 | 0 | S0 + S1 | Re(S*(1-J)) |
| 1 | 10 | 2 | -S0 + S1 | Im(S*(1-J)) |
| 2 | 00 | 0 | S0 + S1 | Re(S*(1-J)) |
| 3 | 10 | 2 | -S0 + S1 | Im(S*(1-J)) |

Fig. 8

| 1 | 6 | 7 | 8 | 9 |
|---|---|---|---|---|
| K | CW_1 BIN | CW_1 DEC | BM_1_K = D(CW_1,S) | BM_1_K = D(CW_1,S) |
| 0 | 11 | 3 | -S0 - S1 | -Re(S*(1-J)) |
| 1 | 01 | 1 | S0 - S1 | -Im(S*(1-J)) |
| 2 | 11 | 3 | -S0 - S1 | -Re(S*(1-J)) |
| 3 | 01 | 1 | S0 - S1 | -Im(S*(1-J)) |

Fig. 9

| 1 | 2 | 3 | 4 | 5 |
|---|---|---|---|---|
| K | CW_0 BIN | CW_0 DEC | BM_0 | BM_0 |
| 0 | 00 | 0 | +S0+S1 | Re(S*(1-J)) |
| 1 | 10 | 2 | -S0+S1 | Im(S*(1-J)) |
| 2 | 00 | 0 | +S0+S1 | Re(S*(1-J)) |
| 3 | 10 | 2 | -S0+S1 | Im(S*(1-J)) |
| 4 | 11 | 3 | -S0-S1 | Re(S*(-1+J)) |
| 5 | 01 | 1 | +S0-S1 | Im(S*(-1+J)) |
| 6 | 11 | 3 | -S0-S1 | Re(S*(-1+J)) |
| 7 | 01 | 1 | +S0-S1 | Im(S*(-1+J)) |
| 8 | 11 | 3 | -S0-S1 | Re(S*(-1+J)) |
| 9 | 01 | 1 | +S0-S1 | Im(S*(-1+J)) |
| 10 | 11 | 3 | -S0-S1 | Re(S*(-1+J)) |
| 11 | 01 | 1 | +S0-S1 | Im(S*(-1+J)) |
| 12 | 00 | 0 | +S0+S1 | Re(S*(1-J)) |
| 13 | 10 | 2 | -S0+S1 | Im(S*(1-J)) |
| 14 | 00 | 0 | +S0+S1 | Re(S*(1-J)) |
| 15 | 10 | 2 | -S0+S1 | Im(S*(1-J)) |

Fig. 10

| 1 | 2 | 3 | 4 | 5 |
|---|---|---|---|---|
| K | CW_0 BIN | CW_0 DEC | BM_0 | BM_0 |
| 16 | 01 | 1 | +S0-S1 | Re(conj(S)*(1-J)) |
| 17 | 11 | 3 | -S0-S1 | Im(conj(S)*(1-J)) |
| 18 | 01 | 1 | +S0-S1 | Re(conj(S)*(1-J)) |
| 19 | 11 | 3 | -S0-S1 | Im(conj(S)*(1-J)) |
| 20 | 00 | 2 | -S0+S1 | Re(conj(S)*(-1+J)) |
| 21 | 10 | 0 | +S0+S1 | Im(conj(S)*(-1+J)) |
| 22 | 00 | 2 | -S0+S1 | Re(conj(S)*(-1+J)) |
| 23 | 10 | 0 | +S0+S1 | Im(conj(S)*(-1+J)) |
| 24 | 00 | 2 | -S0+S1 | Re(conj(S)*(-1+J)) |
| 25 | 10 | 0 | +S0+S1 | Im(conj(S)*(-1+J)) |
| 26 | 00 | 2 | -S0+S1 | Re(conj(S)*(-1+J)) |
| 27 | 10 | 0 | +S0+S1 | Im(conj(S)*(-1+J)) |
| 28 | 01 | 1 | +S0-S1 | Re(conj(S)*(1-J)) |
| 29 | 11 | 3 | -S0-S1 | Im(conj(S)*(1-J)) |
| 30 | 01 | 1 | +S0-S1 | Re(conj(S)*(1-J)) |
| 31 | 11 | 3 | -S0-S1 | Im(conj(S)*(1-J)) |

Fig. 11

| 1 | 2 | 3 | 4 | 5 |
|---|---|---|---|---|
| K | CW_1 BIN | CW_1 DEC | BM_1 | BM_1 |
| 0 | 11 | 3 | -S0-S1 | -Re(S*(1-J)) |
| 1 | 01 | 1 | +S0-S1 | -Im(S*(1-J)) |
| 2 | 11 | 3 | -S0-S1 | -Re(S*(1-J)) |
| 3 | 01 | 1 | +S0-S1 | -Im(S*(1-J)) |
| 4 | 00 | 0 | +S0+S1 | -Re(S*(-1+J)) |
| 5 | 10 | 2 | -S0+S1 | -Im(S*(-1+J)) |
| 6 | 00 | 0 | +S0+S1 | -Re(S*(-1+J)) |
| 7 | 10 | 2 | -S0+S1 | -Im(S*(-1+J)) |
| 8 | 00 | 0 | +S0+S1 | -Re(S*(-1+J)) |
| 9 | 10 | 2 | -S0+S1 | -Im(S*(-1+J)) |
| 10 | 00 | 0 | +S0+S1 | -Re(S*(-1+J)) |
| 11 | 10 | 2 | -S0+S1 | -Im(S*(-1+J)) |
| 12 | 11 | 3 | -S0-S1 | -Re(S*(1-J)) |
| 13 | 01 | 1 | +S0-S1 | -Im(S*(1-J)) |
| 14 | 11 | 3 | -S0-S1 | -Re(S*(1-J)) |
| 15 | 01 | 1 | +S0-S1 | -Im(S*(1-J)) |

Fig. 12

| 1 | 2 | 3 | 4 | 5 |
|---|---|---|---|---|
| K | CW_1 BIN | CW_1 DEC | BM_1 | BM_1 |
| 16 | 10 | 2 | -S0+S1 | -Re(conj(S)*(1-J)) |
| 17 | 00 | 0 | +S0+S1 | -Im(conj(S)*(1-J)) |
| 18 | 10 | 2 | -S0+S1 | -Re(conj(S)*(1-J)) |
| 19 | 00 | 0 | +S0+S1 | -Im(conj(S)*(1-J)) |
| 20 | 10 | 1 | +S0-S1 | -Re(conj(S)*(-1+J)) |
| 21 | 00 | 3 | -S0-S1 | -Im(conj(S)*(-1+J)) |
| 22 | 10 | 1 | +S0-S1 | -Re(conj(S)*(-1+J)) |
| 23 | 00 | 3 | -S0-S1 | -Im(conj(S)*(-1+J)) |
| 24 | 01 | 1 | +S0-S1 | -Re(conj(S)*(-1+J)) |
| 25 | 11 | 3 | -S0-S1 | -Im(conj(S)*(-1+J)) |
| 26 | 01 | 1 | +S0-S1 | -Re(conj(S)*(-1+J)) |
| 27 | 11 | 3 | -S0-S1 | -Im(conj(S)*(-1+J)) |
| 28 | 10 | 2 | -S0+S1 | -Re(conj(S)*(1-J)) |
| 29 | 00 | 0 | +S0+S1 | -Im(conj(S)*(1-J)) |
| 30 | 10 | 2 | -S0+S1 | -Re(conj(S)*(1-J)) |
| 31 | 00 | 0 | +S0+S1 | -Im(conj(S)*(1-J)) |

Fig. 13

VITERBI DECODING DEVICE AND METHOD FOR DECODING A SIGNAL PRODUCED BY A CONVOLUTIONAL ENCODER

FIELD OF THE INVENTION

This invention relates to a Viterbi decoding device and a method for decoding a signal produced by a convolutional encoder.

BACKGROUND OF THE INVENTION

Convolutional encoding is a method commonly used in telecommunications to make a transmitted signal more robust against perturbations and noise. A convolutional encoder transforms a data stream to be transmitted into a coded data stream having a higher bit rate than the original data stream. An individual bit in the coded data stream may be correlated to two or more bits of the original data stream. Such correlations can be exploited on the receiver side to enable forward error correction.

The Viterbi algorithm is an example of a method of decoding a convolutionally encoded signal and is well-known in the art.

SUMMARY OF THE INVENTION

The present invention provides a Viterbi decoding device and a method for decoding a signal produced by a convolutional encoder as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

FIG. 8 shows an example of a table specifying a set of branch metric values corresponding to a first set of transitions.

FIG. 9 shows an example of a table specifying a set of branch metric values corresponding to a second set of transitions.

FIG. 10 shows an example of a table specifying a first set of branch metric values corresponding to a first set of transitions in an example of a convolutional encoder having a total of 64 states.

FIG. 11 shows a table which is a continuation of the table shown in FIG. 10.

FIG. 12 shows an example of table specifying a second set of branch metric values corresponding to a second set of transitions in the example mentioned above in reference to FIG. 10.

FIG. 13 shows a table which is a continuation of the table shown in FIG. 12.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Figure 1:
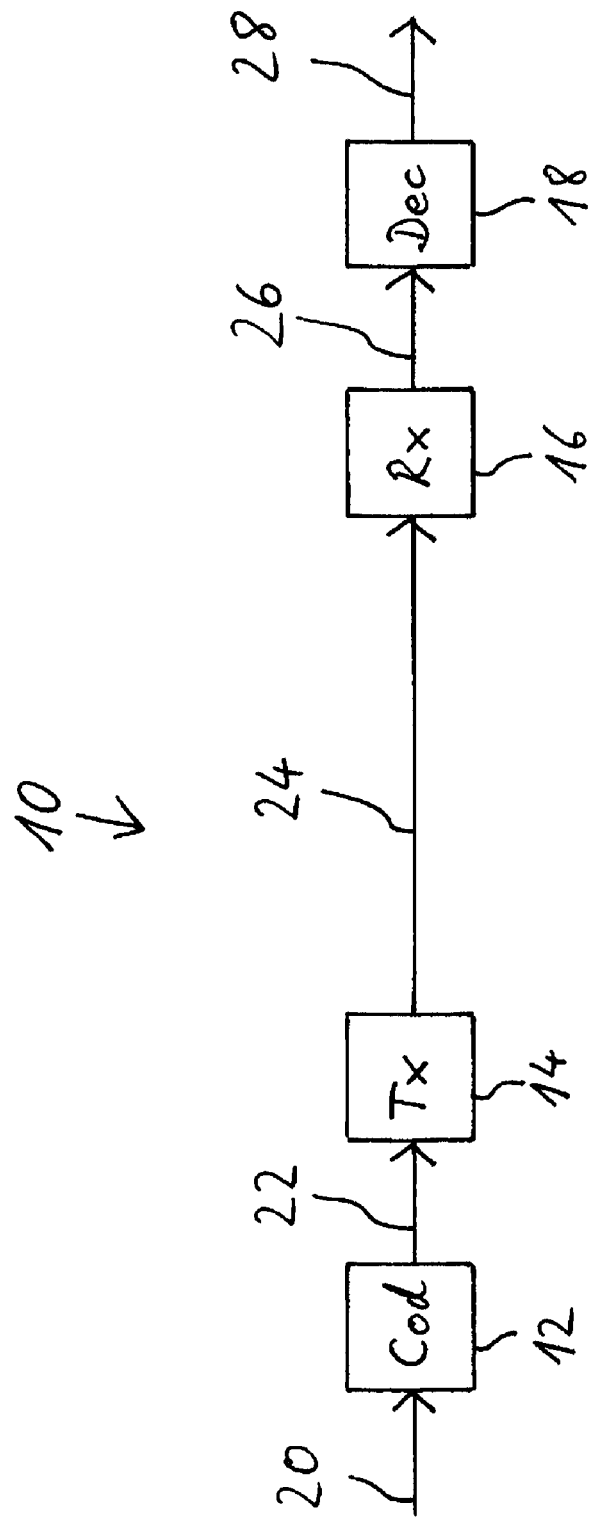
FIG. 1 schematically shows an example of an embodiment of a communication system.

FIG. 1 schematically shows an example of a communication system 10. The communication system 10 may notably comprise an encoder unit 12, a transmitter unit 14, a receiver unit 16, and a decoding unit 18. The transmitter unit 14 may be connected to the coding unit 12. The decoding unit 18 may be connected to the receiver unit 16. The communication system 10 may operate as follows. An input data stream 20 may be fed to the coding unit 12. The data stream 20 fed to the coding unit 12 may also be referred to as the input bit stream. The input bit stream may be a binary sequence, i.e., a succession of bits wherein each bit may have a value of either zero or one. The coding unit 12 may apply a convolutional coding algorithm to the input data stream 20 and thus generate an output data stream 22. The output data stream 22 may also be referred to as the coded data stream or the coded bit stream.

The coded bit stream 22 may have a higher bit rate than the input bit stream 20. The bit rate may be defined as the number of transmitted bits per time unit. The time unit may, for instance, be one second or, if the encoder unit 12 is clocked by a clock cycle, one clock cycle of that clock signal. The bit rate of the coded data stream 22 may notably be an entire multiple of the bit rate of the original data stream 20. More specifically, the coding unit 12 may transform each received bit of the input data stream 20 into a symbol consisting of several, e.g., two, bits. The symbol length, i.e., the number of bits representing one symbol, may be fixed, i.e., every symbol in the output data stream may have the same length. The symbol length may notably be two bits. The bit rate of the output data stream 22 divided by the bit rate of the input data stream 20 may thus coincide with the symbol length. The inverse of this quantity, i.e., the inverse of the symbol length, is known as the code rate.

More generally, the coding unit 12 may be arranged to transform each M-bit input string into an N-bit symbol, where M/N is the code rate and N may be greater than M. This transformation may be a function of the last K−1 input strings. The number K is known as the constraint length of the transformation. The coded data stream 22 may be fed to the transmitter unit 14. The transmitter unit 14 may further transmit the coded data stream 22 to the receiver unit 16, for instance, in the form of a modulated electromagnetic wave 24. The receiver unit 16 may be arranged to recover the coded data stream 22 by demodulating the received signal 24. The receiver unit 16 may, for instance, demodulate the received signal 24 to generate a receiver output signal 26. The receiver output signal 26 may, for instance, be an analog wave form, wherein a high level, e.g., +1 volt, may represent a one bit and a low level, e.g., −1 volt, may represent a zero bit.

The receiver output signal 26 may be fed to the decoder unit 18. The decoder unit 18 may be arranged to decode the receiver output signal 26 to generate a decoder output signal 28. In the absence of transmission or decoding errors, the decoder output signal 28 may be identical to the input data stream 20. Furthermore, a transmission error, e.g., a loss of isolated bits, may not necessarily generate an error in the decoder output signal 28 due to a certain redundancy of the information carried by the coded data stream 22. The decoder unit 18 may, for instance, employ a Viterbi algorithm for decoding the coded data stream 22 represented by, e.g., the receiver output signal 26.

Figure 2:
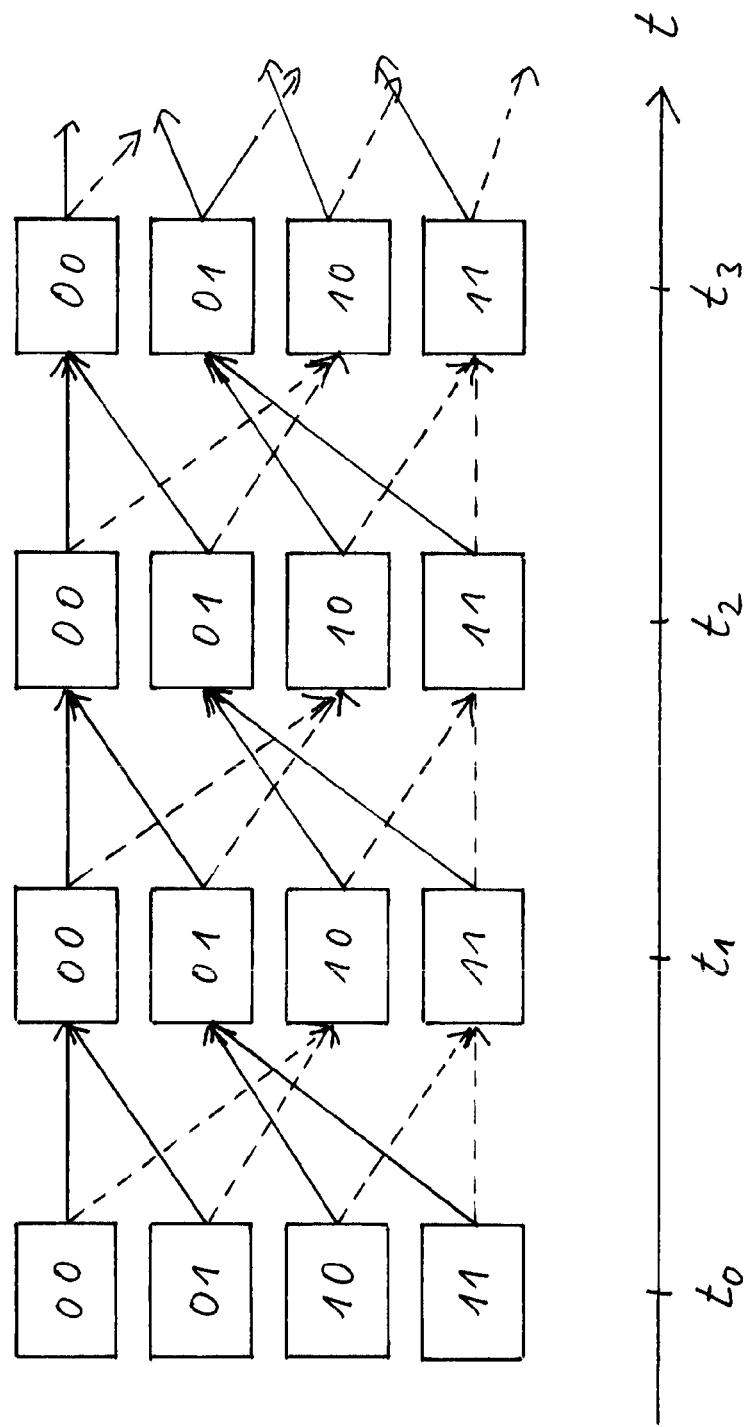
FIG. 2 shows an example of a trellis diagram.

An example of the coding unit 12 is further described in reference to FIG. 2. FIG. 2 shows a trellis diagram for the coding unit 12, considering the coding unit 12 a state machine. In this example, the state machine may have four possible states: 00, 01, 10, 11. The arrow t in the figure may represent the flow of time. At each instant, e.g., at each instant t0, t1, t2, or t3, the state of the coding unit 12 may be either 00, 01, 10, or 11. The current state of the encoder unit 12 may, for instance, be the current state of a shift register (not shown) of the coder unit 12. The state of the shift register may represent the values of the two last received bits of the input data stream 20. For instance, a first bit of value zero followed by a second bit of value one may set the shift register (and thus the coding unit 12) to the state 01 at time t0. Reception of a third bit may trigger a state transition resulting in a new state at instant t1. For instance, still assuming that the coder unit 12 is in its state 01 at time t0, a zero bit may trigger the transition 01 to 00, whereas a one bit may trigger the transition 01 to 11. In the present trellis diagram, transitions triggered by a one bit are represented by continuous arrows, while transitions triggered by a one bit are represented by dashed arrows. The input data stream 20 may thus be identified with a particular path through the trellis diagram. For instance, assuming that the decoder state is 00 at time t0, the bit sequence 110 results in the path 00-10-11-01.

Each of the eight transitions associated with the set of four states may have associated with it a code word which may be output as the next symbol of the output data stream 22.

Figure 3:
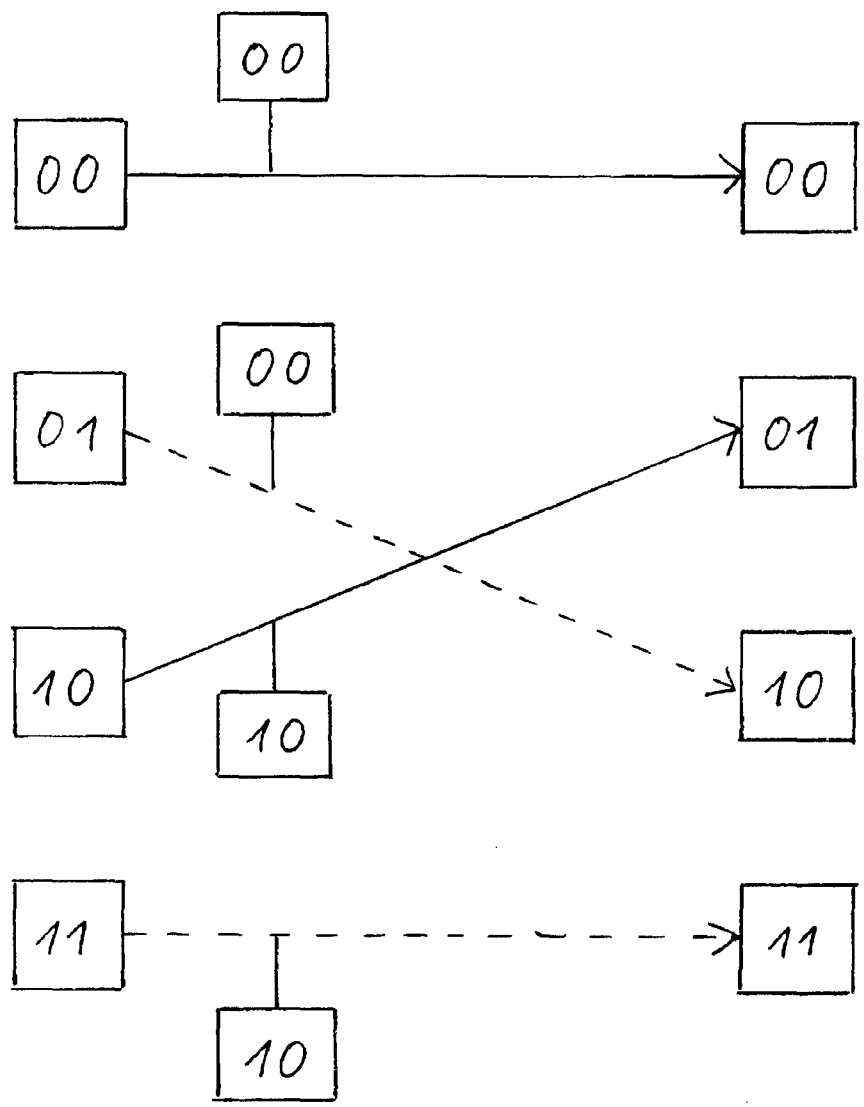
FIG. 3 schematically shows a first example of a first set of transitions in the trellis diagram of FIG. 2.

For instance, now additionally considering FIG. 3, the code words associated with the transitions 00-10, 01-10, 10-01, and 11-11 may be 00, 00, 10, and 10, respectively. In the figure, these code words are represented as tags to the arrows of the respective transitions. Furthermore, now turning to FIG. 4, the transitions 00-10, 01-00, 10-11, and 11-01 may have the code words 11, 11, 01, and 01, respectively. In this example, each code word is a bit string consisting of a first bit and a second bit. In other words, the code word length may be two. Indeed, the present specification focuses on an implementation in which the code word length may be two. However, the teaching of the present disclosure can perhaps also be used in a scheme in which code word consists of more than two bits and notably in a scheme in which code word consists of a pair number of bits.

Turning back to FIGS. 3 and 4, it is noted that the mapping from transitions to code words is not necessarily unique. For instance, the symbol 11 may result from either the transition 00 to 10 or the transition 01 to 00. To reconstruct the most likely path through the trellis diagram and thus the original data stream 20, the Viterbi decoding algorithm therefore involves a comparison between a variety of paths, e.g., all paths, of the trellis diagram and selecting a winning path, i.e., a path which corresponds best to the received sequence of symbols in, e.g., the receiver output signal 26. To this end, a distance between the last received symbol and each of the eight transitions shown in FIGS. 3 and 4 may be computed, resulting in a set of eight branch metric values associated with the eight transitions (branches). The actual computation may involve computing less than eight values due to algebraic symmetries. The details of these computations may depend on the definition of the distance between the received symbol and the various transitions.

The sum of branch metric values associated with a given path through the trellis diagram (see FIG. 2) is known as the path metric value. The original bit stream 20 may be recovered by selecting the path having the smallest path metric value. The path metric value for a given state at a given instant, e.g., the path metric value for the state 00 at time t3 in FIG. 2, may be obtained from the path metric values of the two predecessor states (states 00 and 01 in this example) by adding the corresponding branch metric value, thus obtaining two new path metric values and by further selecting the smaller one of these two path metric values. For example, the path metric value of state 00 at time t2 (see again FIG. 2) plus the branch metric value for the transition 00 to 00 may result in a first candidate path metric value of the state 00 at time t3. Similarly, the path metric value of the state 01 at time t2 plus the branch metric value for the transition 01 to 00 may give a second candidate path metric value associated with the state 00 at time t3. The smaller one among these two candidate path metric values may be selected as the path metric value of the state 00 at time t3. Furthermore, the transition associated with the selected candidate path metric value, i.e., the winning path metric value, may be represented by a decision matrix. Thus, each state at a chosen instant, e.g., time t3 may have a winning path leading to that state, said winning path having associated with it a path metric value. In the present example of a set of four states, there may thus be four winning paths for the chosen instant (e.g., time t3). More specifically, each state may have a winning path leading to that particular state. Selecting among these winning paths the one with the smallest path metric value may be expected to provide the original data stream 20 up to that instant or up to at least some earlier instant (e.g., time t0).

Figure 4:
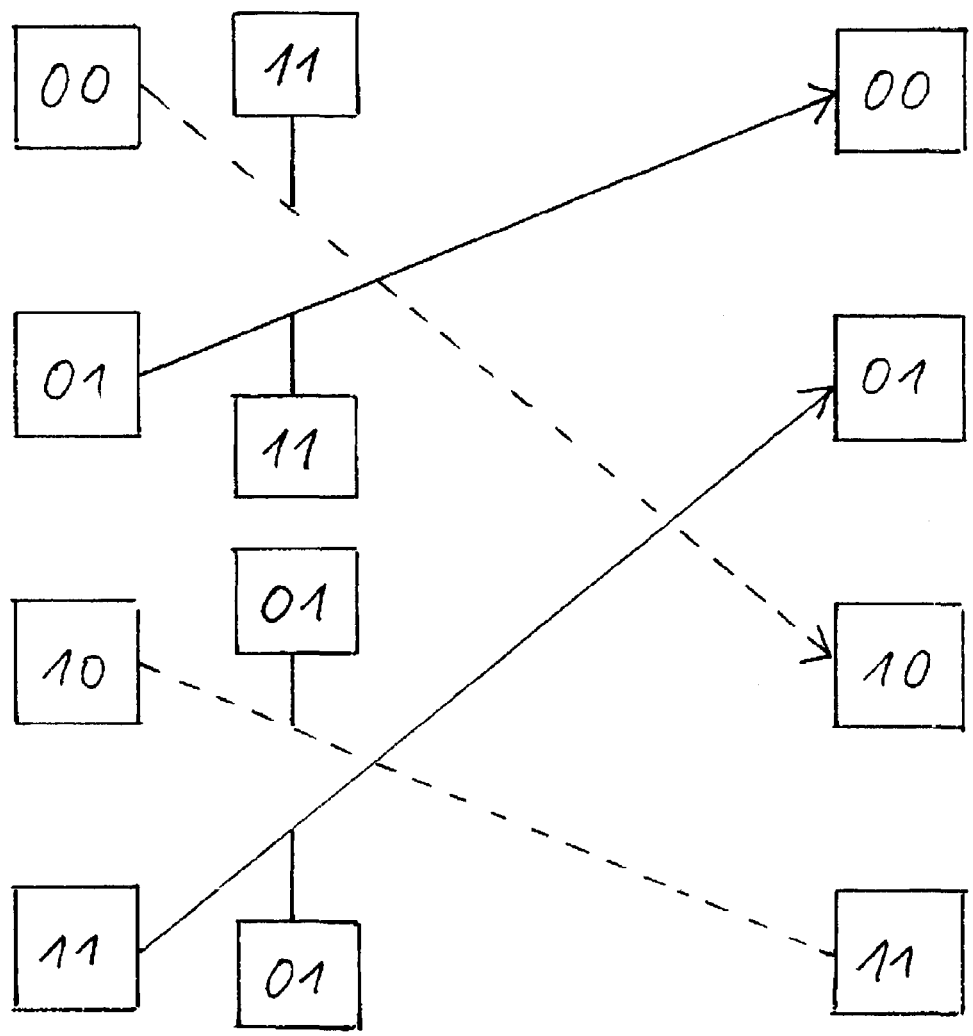
FIG. 4 schematically shows a second set of transitions in the trellis diagram of FIG. 2 in accordance with the example of FIG. 3.
Figure 5:
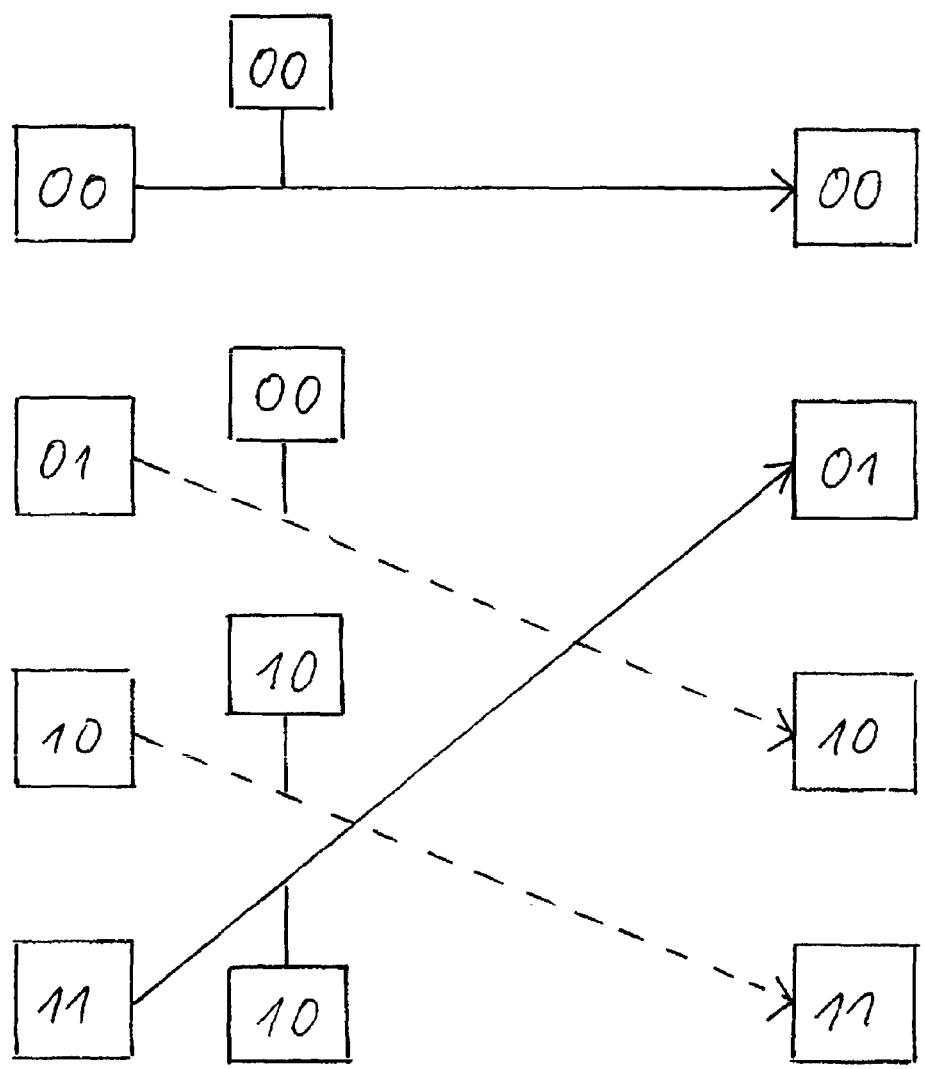
FIG. 5 schematically shows a second example of a first set of transitions in the trellis diagram of FIG. 3.
Figure 6:
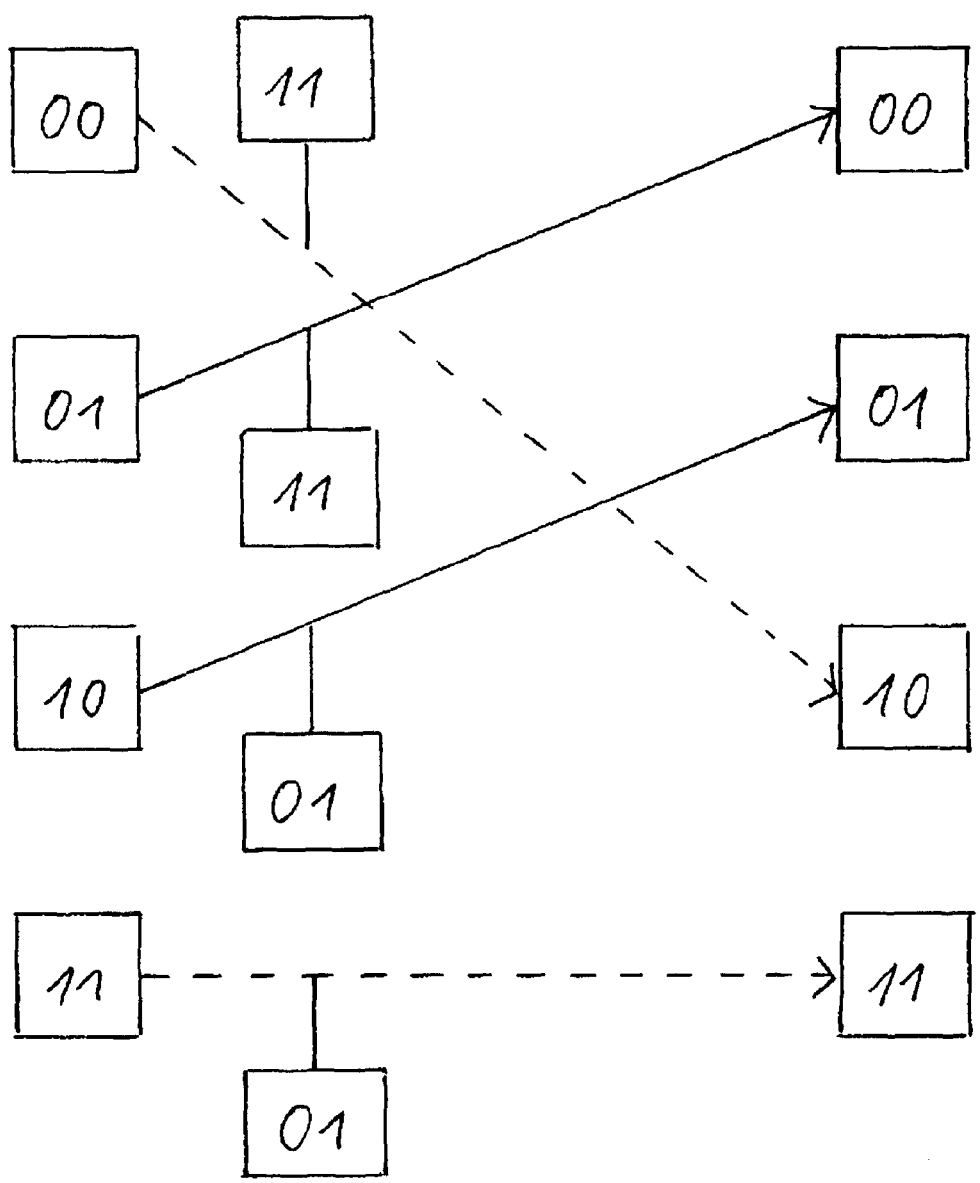
FIG. 6 shows a second set of transitions in the trellis diagram in accordance with this second example.

FIGS. 5 and 6 are analogous to FIGS. 3 and 4 and illustrate a second example of an assignment of code words to the eight transitions described above.

Figure 7:
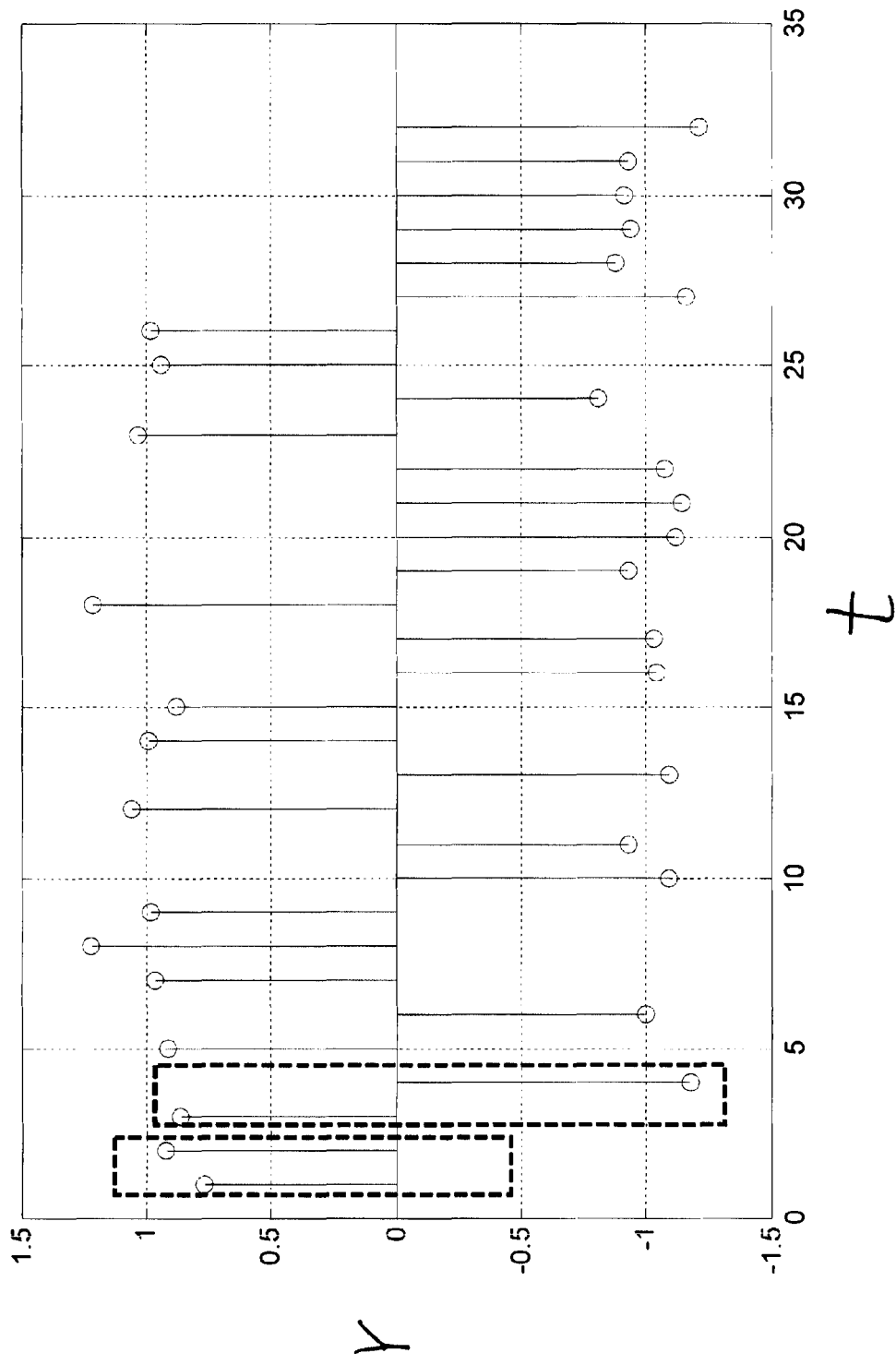
FIG. 7 schematically shows an example of a sequence of soft symbols.

Referring now to FIG. 7, an example of a sequence of sample values taken from, e.g., the receiver output signal 26 (see FIG. 1) is illustrated. Each circle in the plot may indicate an instantaneous level y of, e.g., the receiver output signal 26 at time t. The samples may be grouped in successive pairs, each pair representing a received symbol of two bits. For example, the four samples taken at times 1, 2, 3, and 4, respectively, may in this example have a value y=0.74, 0.95, 0.85, and −1.2, respectively. These values may be rounded to yield the sequence 1, 1, 1, −1 which may be interpreted as the bit sequence 1110 , assuming that the bit values 0 and 1 correspond to the analog levels of −1 and +1 , respectively. Rounding the sample values may thus yield a bit sequence known as a sequence of hard bits. In other words, each sample value may be converted into a hard bit. A pair of sample values may thus yield a hard symbol. The branch metric values mentioned above may be computed on the basis of the thus obtained hard symbols. The branch metric values may, for instance, be defined as Hamming distances between the hard symbols and the code words.

Alternatively, the successive pairs of sample values may be treated as soft symbols, each soft symbol comprising a first sample value S0 and a second sample value S1. The branch metric values may, in this case, be computed directly from the soft symbols rather than from hard symbols derived from the soft symbols. Processing a soft symbol may involve a larger computational effort compared to working with hard symbols because a soft symbol may take more than only two different values. On the other hand, working with soft symbols rather than with hard symbols can make the decoding algorithm more reliable. In the example of FIG. 7, the first two soft symbols are S=(0.74; 0.95) and S=(0.85; −1.2).

The distance between a code word CW and soft symbol S may, for instance, be chosen Euclidean. For instance, expressing the code word CW as the pair (B0, B1) and the soft symbol S as (S0, S1), the distance between them may be defined as $$D(CW,S)=(B0-S0)2+(B1-S1)2$$

wherein B0, S0, B1, and S1 are the analog levels of the first and second bits of the code word CW and of the soft symbol S, respectively. The double asterisk means "to the power of". The analog levels of the code word bits may be −1 and +1, for example. The values of the soft bits S0 and S1 may typically be approximately −1 or +1, but deviations from these expected values are possible due to, e.g., noise, interference, and other kinds of transmission deficiencies. The distances for the four different code words 00, 01, 10, and 11 can thus be expressed explicitly as $$D(00,S)=(-1-S0)2+(-1-S1)2$$

$$D(01,S)=(-1-S0)2+(1-S1)2$$

$$D(10,S)=(1-S0)2+(0-S1)2$$

$$D(11,S)=(1-S0)2+(1-S1)2$$

Expanding the above expressions and omitting the terms S0 to the power of 2 and S1 to the power of two in each of the terms, the distance D(CW,S) may be redefined as follows:

$$D(00,S)=S0+S1$$

$$D(01,S)=S0-S1$$

$$D(10,S)=-S0+S1=-D(01,S)$$

$$D(11,S)=-S0-S1=-D(00,S)$$

Considering the pair S=(S0, S2) as a complex number S=S0+J*S1 and multiplying S or conj(S) with (1−J) yields:

$$S*(1-J)=D(00,S)+J*D(10,S)$$

$$-S*(1-J)=D(11,S)+J*D(01,S)$$

$$conj(S)*(1-J)=D(01,S)+J*D(11,S)$$

$$-conj(S)*(1-J)=D(10,S)+J*D(00,S)$$

This may rearranged as:

$$D(0,S)+J*D(2,S)=S*(1-J)$$

$$D(2,S)+J*D(0,S)=conj(S)*(-1+J)$$

$$D(1,S)+J*D(3,S)=conj(S)*(1-J)$$

$$D(3,S)+J*D(1,S)=S*(-1+J)$$

wherein the code words (0,0), (0,1), (1,0), and (1,1) are denoted 0, 1, 2, and 3, respectively, and "conj" denotes complex conjugation.

These expressions shows that a pair of distance values may be obtained from a single complex multiplication of the complex soft symbol S or its conjugate and the complex number (1−J) or (−1+J). This can be exploited to compute the branch metric values in a particularly fast manner using a complex algebra unit capable of processing the real and imaginary parts of a complex number in parallel.

The table in FIG. 8 relates to the states, transitions and associated code words shown in FIG. 3. The four possible final states 00, 01, 10, and 11 are listed in column 1 as 0, 1, 2, and 3, respectively. The letter K represents the corresponding index (not to be confused with the constraint length). Column 2 indicates the code word associated with a transition to a respective state for the set of transitions shown in FIG. 3. Column 3 shows the code words using decimal notation. Column 4 shows the corresponding branch metric values, i.e., the distances between the respective code word CW and the received soft symbols. Column 5 indicates the equivalent complex expressions. The complex expressions can be conveniently used to evaluate a pair of branch metric values. For instance, the complex number S*(1−J) may be computed using complex algebra to obtain simultaneously the branch metric values for the two transitions 00-00 (K=0) and 10-01 (K=1) shown in FIG. 3. The branch metric values for K=2 and K=3 can likewise be obtained from the same complex number S*(1−J).

The table in FIG. 9 is analogous to the one of FIG. 8 but refers to the second set of transitions leading to the state 00, 01, 10, and 11, respectively, as shown in FIG. 4. It is noted that their branch metric values differ from the ones associated with the first set of transitions (see FIGS. 3 and 8) only in a minus sign. Therefore, they do not need to be explicitly computed. Instead, the second candidate path metric values associated with them may be computed from the path metric values of the respective predecessor state by subtracting (instead of adding) the branch metric values specified in FIG. 8.

It is further noted that FIGS. 8 and 9 may equally apply to the two sets of transitions and the associated code words shown in the example of FIGS. 5 and 6.

The tables in FIGS. 10 and 11 are analogous to the table of FIG. 8 but relate to an example in which the encoder unit 12 has a total of 64 states. The branch metric values for the states K=32 to K=63 may be related to those indicated in the table by the identity BM_0(K)=−BM_0(K−32).

The tables in FIGS. 12 and 13 are analogous to those of FIGS. 10 and 11 and refer to the mentioned second set of path metric values. As in the example of FIGS. 3 and 4, the branch metric values BM_0 and BM_1 of the first and second set of transitions may differ from each other only in a minus sign.

Figure 14:
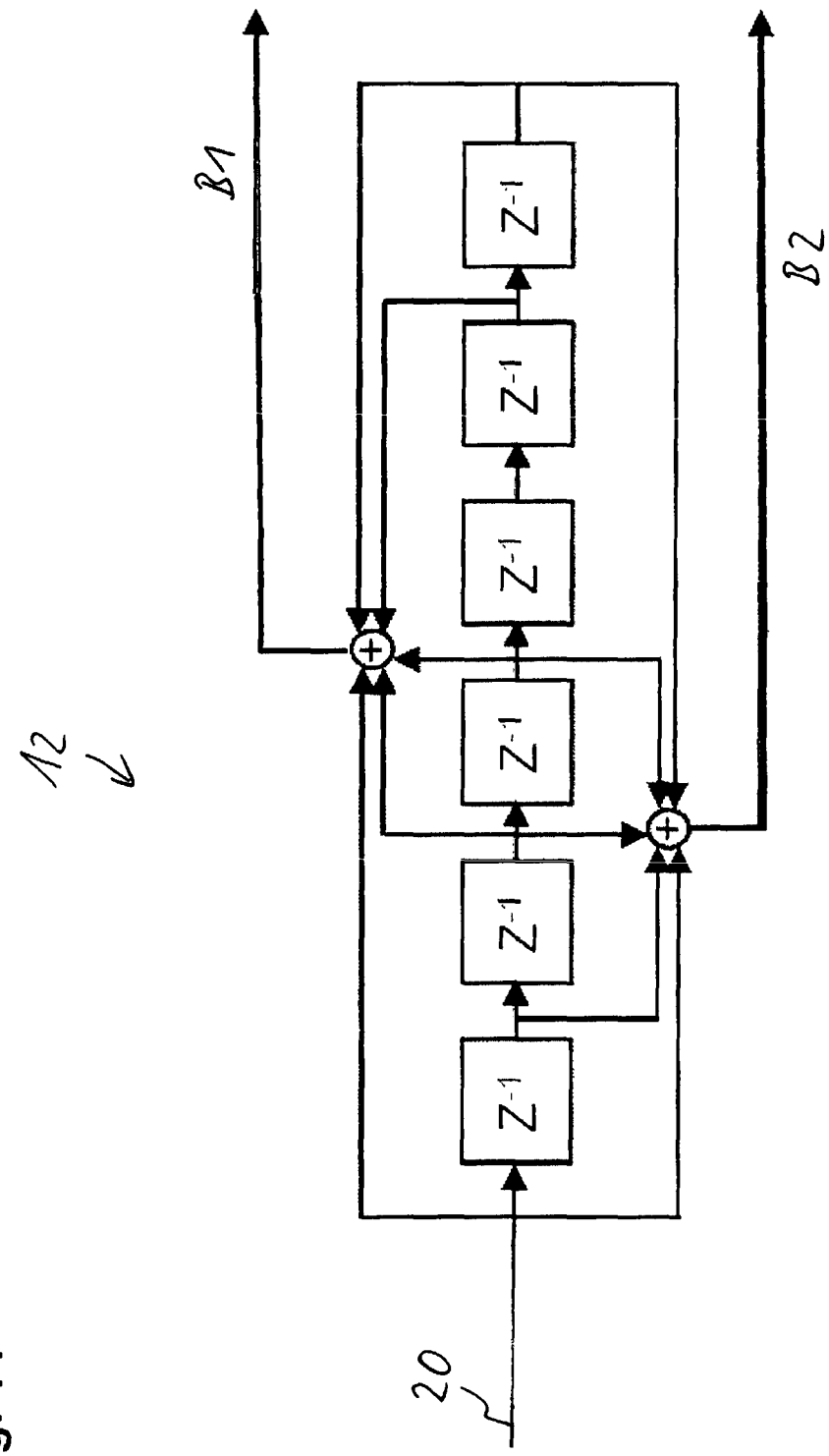
FIG. 14 schematically illustrates an example of a convolutional encoder.

FIG. 14 schematically represents an example of the encoder 12. The encoder 12 may comprise a set of, e.g., six shift registers connected in series for buffering the latest K−1 received bits of the input data stream 20. In the shown example, K=7, K being the constraint length including the latest bit. The encoder unit 12 may be based on octal generator polynomials [133 171].

Figure 15:
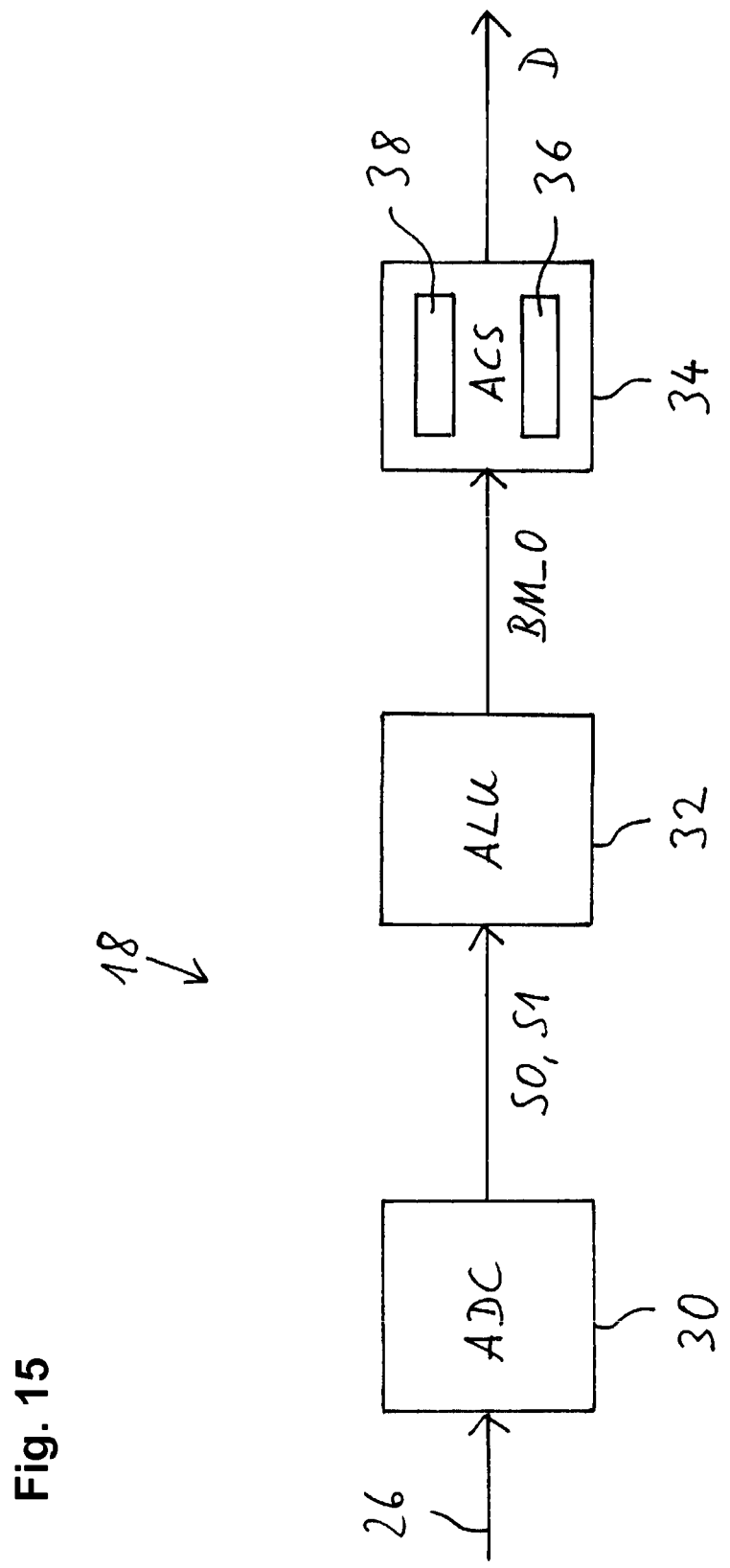
FIG. 15 schematically shows an example of a Viterbi decoder.

An example of the decoder unit 18 is further described in reference to FIG. 15. The decoder unit 18 may comprise an analog to digital converter (ADC) unit 30, a complex algebra unit 32, and an add compare select (ACS) unit 34. The complex algebra unit 32 may be connected to the ADC unit 30. The complex algebra unit 32 may, for instance, be integrated in an arithmetic logic unit of a processor core. The decoder unit 18 may operate as follows. The ADC unit 30 may receive the receiver output signal 26 described above in reference to FIG. 1 and generate from this analog signal 26 a stream of soft symbols S, each soft symbol S being a pair of a first sample value S0 (first soft bit) and a second sample value S1 (second soft bit). Each soft symbol S may be provided as a pair of two digital numbers or as a digital complex number. The stream of soft symbols S may be further fed to the complex algebra unit 32. The complex algebra unit 32 may compute from each received soft symbol S a set of branch metric values. The complex algebra unit 32 may, for example, compute a branch metric value BM_0(K) for each state of the encoder unit 12. The computed branch metric values may be further fed to the ACS unit 34. The ACS unit 34 may compute a first candidate path metric value and a second candidate path metric value for each state of the encoder unit 12 and select a winning path metric value. To this end, the ACS unit 34 may comprise a first path metric buffer 36 and a second path metric buffer 38. The ACS unit 34 may further generate a set of decision values D for each state of the coder unit 12, the decision values indicating which path metric value among the first and second candidate path metric values was selected as the winning one for each state. The decision values thus generated may be used to update a decision matrix reflecting the decoded data stream. Add compare select units for processing branch metric values are known in the art, and a variety of different architectures are known.

The complex algebra unit 32 may be designed to take full advantage of the complex number representation of the soft symbols S and the corresponding complex expression for pairs of branch metric values described herein. The complex algebra unit 32 may thus compute a pair of branch metric values from a single complex soft symbol S=S0+J*S1 in parallel. The complex algebra unit 32 may, for instance, comprise or be integrated in a digital signal processor which may comprise dedicated complex number processing circuitry. The complex computations may thus be performed with the same speed as real computations. An advantage of computing pairs of branch metric values using complex algebra is that these computations can be performed about twice as fast as equivalent real computations using, for instance, a general purpose processor with complex algebra capabilities.

The invention may also be implemented in a computer program for running on a computer system, at least including code portions for performing steps of a method according to the invention when run on a programmable apparatus, such as a computer system or enabling a programmable apparatus to perform functions of a device or system according to the invention.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on computer readable storage medium or transmitted to the computer system via a computer readable transmission medium. All or some of the computer program may be provided on transitory or non-transitory computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Also for example, in one embodiment, the illustrated examples may be implemented as circuitry located on a single integrated circuit or within a same device. For example, units 16 and 18 may be located on a single integrated circuit. Alternatively, the examples may be implemented as any number of separate integrated circuits or separate devices interconnected with each other in a suitable manner. For example, units 16 and 18 may be separate devices connected to each other.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A Viterbi decoding device for decoding a signal produced by a convolutional encoder, said encoder having N different states, each of said N states having two predecessor states, each branch from each of said two predecessor states having a static code word CW=(B0, B1) having a first bit B0 and a second bit B1, said first bit B0 having either a value −1 or +1 and said second bit B1 having either the value −1 or +1, said signal having a sequence of code words, said device comprising:

an analog-to-digital conversion unit arranged to extract a soft symbol S=(S0, S1) from said signal, said soft symbol comprising a first sample value S0 and a second sample value S1; and a digital processing unit connected to said analog-to-digital conversion unit and arranged to compute, for each of said N states, a branch metric value BM_0_K in dependence on said soft symbol S, K being an index identifying a respective state;

said digital processing unit arranged to:

store said soft symbol S as a complex number S=S0+J*S1 in a complex number format; and compute a complex branch metric value BM_0_(K, K')=BM_0_K+J*BM_0_K' in the complex number format on the basis of said soft symbol S, with K different from K'.

2. The device of claim 1, each of said branch metric values BM_0_K indicating a distance D(CW, S) between said soft symbol S and the codeword CW associated with the transition from one of said two predecessor states to the state with index K.

3. The device of claim 2, said distance D(CW, S) being a Euclidean distance.

4. The device of claim 2, said distance being defined as $$D(CW, S) = D(B0, B1, S0, S1) = (S0-B0)2 + (S1-B1)2.$$

5. The device of claim 1, wherein
BM_0_K=S0+S1 if CW_K=(−1, −1);
BM_0_K=S0−S1 if CW_K=(−1, 1);
BM_0_K=−S0+S1 if CW_K=(1, −1);
BM_0_K=−S0−S1 if CW_K=(1, 1)
for any K identifying one of said N states, CW_K being the code word CW associated with the transition from one of said two predecessor states to the state with index K.

6. The device of claim 1, said digital processing unit arranged to compute said complex branch metric value BM_0_(K, K')=BM_0_K+J*BM_0_K' by either:
multiplying S and (1−J); or
multiplying conj(S) and (−1+J); or
multiplying conj(S) and (1−J); or
multiplying S and (−1+J).

7. The device of claim 1, said digital processing unit arranged to perform one or more complex algebra operations to compute the real part BM_0_K and the imaginary part BM_0_K' of said complex branch metric value BM_0_(K, K') simultaneously.

8. The device of claim 1, comprising storing said branch metric values BM_0_K as a vector (BM_0_0, BM_0_1, ..., BM_0_{N−1}), each pair (BM_0_{2*K}, BM_0_{2*K+1}) among the components of said vector being associated with one of the following pairs of code words: (CW0, CW2), (CW2, CW0), (CW1, CW3), and (CW3, CW1), wherein CW0, CW1, CW2, and CW3 denote the two-bit code words (−1, −1), (−1, 1), (1, −1), and (1, 1), respectively.

9. The device of claim 1, said digital processing unit being programmable.

10. The device of claim 1, said digital processing unit being a digital signal processor.

11. A Viterbi decoding method for decoding a signal produced by a convolutional encoder, said encoder having N different states, each of said N states having two predecessor states, each branch from each of said two predecessor states having a static codeword CW=(B0, B1) a first bit B0 and a second bit B1, said first bit B0 having either a value −1 or +1 and said second bit B1 having either the value −1 or +1 , said signal having a sequence of code words said method comprising:

extracting a soft symbol S=(S0, S1) from said signal, said soft symbol comprising a first sample value S0 and a second sample value S1;

for each of said N states, computing a branch metric value BM_0_K in dependence on said soft symbol S, K being an index identifying a respective one of said N states;

said computation of said branch metric values comprising:
said soft symbol S as a complex number S=S0+J*S1 using a complex number format, J being the imaginary unit; and
computing a complex branch metric value BM_0_(K, K')=BM_0_K+J*BM_0_K' in the complex number format in dependence on said complex number S, with K different from K'.

12. The method of claim 11, further comprising:
updating a path metric value PM_K in dependence on said branch metric value BM_0_K.

13. The method of claim 11, each of said branch metric values BM_0_K indicating a distance D(CW, S) between said soft symbol S and the codeword CW associated with the transition from one of said two predecessor states to the state with index K.

14. The method of claim 13, said distance D(CW, S) being a Euclidean distance.

15. The method of claim 13, said distance being defined as $D(CW, S)=D(B0,B1,S0,S1)=(S0-B0)2+(S1-B1)2.$ 16. The method of claim 11, wherein
BM_0_K=S0+S1 if CW_K=(-1, -1);
BM_0_K=S0-S1 if CW_K=(-1, 1);
BM_0_K=-S0+S1 if CW_K=(1, -1);
BM_0_K=-S0-S1 if CW_K=(1, 1)
for any K identifying one of said N states, CW_K being the codeword CW associated with the transition from one of said two predecessor states to the state with index K.

17. The method of claim 11, further comprising:
computing said complex branch metric value BM_0_(K, K')=BM_0_K+J*BM_0_K' by either:
multiplying S and (1−J); or
multiplying conj(S) and (−1+J); or
multiplying conj(S) and (1−J); or
multiplying S and (−1+J).

18. The method of claim 11, further comprising:
performing or more complex algebra operations to compute the real part BM_0_K and the imaginary part BM_0_K' of said complex branch metric value BM_0_(K, K') simultaneously.

19. The method of claim 11, comprising storing said branch metric values BM_0_K as a vector (BM_0_0, BM_0_1, . . . , BM_0_{N−1}), each pair (BM_0_{2*K}, BM_0_{2*K+1}) among the components of said vector being associated with one of the following pairs of code words: (CW0, CW2), (CW2, CW0), (CW1, CW3), and (CW3,CW1), wherein CW0, CW1, CW2, and CW3 denote the two-bit code words (−1, −1), (−1, 1), (1, −1), and (1, 1), respectively.

20. A Viterbi decoding device comprising:
an analog-to-digital conversion unit to extract a soft symbol S=(S0, S1) from a signal produced by a convolutional encoder; and
a digital processing unit to communicate with the analog-to-digital conversion unit, the digital processing unit to:
compute, for each of N different states of the signal, a branch metric value (BM_0_K) in dependence on the soft symbol S, K being an index identifying a respective state;
store said soft symbol S as a complex number S=S0+J*S1 in a complex number format; and
compute a complex branch metric value BM_0_(K, K')=BM_0_K+J*BM_0_K' in the complex number format on the basis of said soft symbol S, with K different from K'.

\* \* \* \* \*